United States Patent
Cheng et al.

(10) Patent No.: US 10,224,246 B2
(45) Date of Patent: Mar. 5, 2019

(54) MULTI-LAYER FILLED GATE CUT TO PREVENT POWER RAIL SHORTING TO GATE STRUCTURE

(71) Applicant: INTERNATIONAL BUSINESS MACHINES CORPORATION, Armonk, NY (US)

(72) Inventors: Kangguo Cheng, Schenectady, NY (US); Hao Tang, Albany, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/620,095

(22) Filed: Jun. 12, 2017

(65) Prior Publication Data

US 2018/0053694 A1    Feb. 22, 2018

Related U.S. Application Data

(62) Division of application No. 15/241,898, filed on Aug. 19, 2016, now Pat. No. 9,805,983.

(51) Int. Cl.
*H01L 21/8234* (2006.01)
*H01L 23/50* (2006.01)
(Continued)

(52) U.S. Cl.
CPC .... *H01L 21/823475* (2013.01); *H01L 21/022* (2013.01); *H01L 21/0217* (2013.01);
(Continued)

(58) Field of Classification Search
CPC ....... H01L 21/823475; H01L 29/66545; H01L 29/66795; H01L 21/31053; H01L 21/0217;
(Continued)

(56) References Cited

U.S. PATENT DOCUMENTS 4,980,306 A    12/1990  Shimbo
5,010,386 A     4/1991  Groover, III
(Continued)

OTHER PUBLICATIONS

List of IBM Patents or Patent Applications Treated as Related dated Jun. 12, 2017, 2 pages.
(Continued)

*Primary Examiner* — Sonya D. McCall-Shepard
(74) *Attorney, Agent, or Firm* — Tutunjian & Bitetto, P.C.; Vazken Alexanian

(57) ABSTRACT

A method of forming a power rail to semiconductor devices that includes forming a gate structure extending from a first active region to a second active region of a substrate, and removing a portion of the gate structure forming a gate cut trench separating the first active region from the second active region. A fill material of an alternating sequence of at least two different composition conformally deposited dielectric layers is formed within the gate cut trench. A power rail is formed in the gate cut trench. An aspect ratio of the vertically orientated portions of the alternating sequence of the at least two different composition conformally deposited dielectric layer obstructs lateral etching of the gate cut trench during etching to form a power rail opening for housing the power rail.

20 Claims, 5 Drawing Sheets

(51) Int. Cl.
| | |
|---|---|
| *H01L 29/66* | (2006.01) |
| *H01L 21/02* | (2006.01) |
| *H01L 21/3105* | (2006.01) |
| *H01L 21/311* | (2006.01) |
| *H01L 21/768* | (2006.01) |

(52) U.S. Cl.
CPC .. *H01L 21/02164* (2013.01); *H01L 21/31053* (2013.01); *H01L 21/31116* (2013.01); *H01L 21/76804* (2013.01); *H01L 21/823431* (2013.01); *H01L 21/823437* (2013.01); *H01L 23/50* (2013.01); *H01L 29/66545* (2013.01); *H01L 29/66795* (2013.01)

(58) Field of Classification Search
CPC ............... H01L 23/50; H01L 21/02164; H01L 21/823437; H01L 21/823431; H01L 21/31116; H01L 21/022; H01L 21/76804; H01L 21/76224; H01L 21/76283; H01L 27/0207; H01L 23/5226; H01L 23/5286; H01L 21/76895; H01L 21/76877; H01L 23/528; H01L 27/11807; H01L 2027/11875; H01L 21/7684; H01L 23/481; H01L 23/522; H01L 27/088; H01L 27/14636; H01L 2027/11881; H01L 29/0847

See application file for complete search history.

(56) References Cited

U.S. PATENT DOCUMENTS

| | | |
|---|---|---|
| 5,384,274 A | 1/1995 | Kanehachi |
| 6,017,791 A | 1/2000 | Wang et al. |
| 8,815,670 B2 | 8/2014 | Basker et al. |
| 9,064,932 B1 | 6/2015 | Pham et al. |
| 9,252,021 B2 | 2/2016 | Ng et al. |
| 9,263,442 B2 | 2/2016 | Anderson et al. |
| 2015/0340461 A1 | 11/2015 | Wei et al. |
| 2016/0056181 A1 | 2/2016 | Anderson et al. |
| 2016/0233164 A1* | 8/2016 | Choi ................... H01L 27/0924 |

OTHER PUBLICATIONS

List of IBM Patents or Patent Applications Treated as Related dated Apr. 16, 2018, 2 pages.

* cited by examiner

MULTI-LAYER FILLED GATE CUT TO PREVENT POWER RAIL SHORTING TO GATE STRUCTURE

BACKGROUND

Technical Field

The present description relates to contact structures and gate structures used in semiconductor devices, and methods for forming contact structures and gate structures in semiconductor devices using subtractive etching.

Description of the Related Art

Modern integrated circuits are made up of literally millions of active devices such as transistors. Field effect transistors (FETs) are widely used in the electronics industry for switching, amplification, filtering and other tasks related to both analog and digital electrical signals. Most common among these are metal oxide semiconductor field effect transistors (MOSFET or MOS), in which a gate structure is energized to create an electric field in an underlying channel region of a semiconductor body, by which electrons are allowed to travel through the channel between a source region and a drain region of the semiconductor body. Continuing trends in semiconductor device manufacturing include a reduction in electrical device feature size (scaling). With increasing scaling, new processing sequences and methods may be required to avoid shorting of adjacent electrical devices.

SUMMARY

In one embodiment, a method of forming a power rail to an electrical device is disclosed that includes forming a gate structure extending from a first active region to a second active region of a substrate; and removing a portion of the gate structure to form a gate cut trench separating a first portion of the gate structure overlying the first active region from a second portion of the gate structure overlying the second active region. The method may further include forming a fill material of an alternating sequence of at least two different composition conformally deposited dielectric layers within the gate cut trench. A power rail is formed in the gate cut trench, in which an aspect ratio of the vertically orientated portions of the alternating sequence of the at least two different composition conformally deposited dielectric layers obstructs lateral etching of the gate cut trench during etching to form a power rail opening for housing the power rail.

In another embodiment, the method of forming the power rail to semiconductor devices may include forming a gate structure extending from a first active region to a second active region of a substrate; and removing a portion of the gate structure forming a gate cut trench separating a first portion of the gate structure overlying the first active region from a second portion of the gate structure overlying the second active region. In a following step, a fill material of an alternating sequence of a nitride containing conformally deposited layer and an oxide containing conformally deposited layer is deposited within the gate cut trench. A power rail is formed in the gate cut trench, wherein an aspect ratio of the vertically orientated portions of the alternating sequence of the nitride containing conformally deposited layer and the oxide containing conformally deposited layer obstructs lateral etching of the gate cut trench during etching to form a power rail opening for housing the power rail. The multilayer film of the fill material for the gate cut trench obstruct not only etching in the vertical direction, but etching in the lateral direction as well. For example, for a first reactive ion etch (RIE) for forming the gate contact, the etch may be an oxide etch that will stop on a nitride layer. A second reactive ion etch step for the gate contact etch may be a nitride etch, which will stop at the next oxide layer.

In another embodiment, an electrical device is also provided that may include a first active region having a first gate structure, and a second active region having a second gate structure, wherein the first and second gate structures are aligned to one another and separated by a gate cut trench. In some embodiments, an alternating sequence of a nitride containing conformal layer and an oxide containing conformal layer fills a lower portion of the gate cut trench, wherein a core of one of the nitride containing or the oxide containing material is centrally positioned in the lower portion of the gate cut trench. The electrical device may further include a power rail in an upper portion of the gate cut trench.

BRIEF DESCRIPTION OF DRAWINGS

The following description will provide details for some preferred embodiments with reference to the following figures wherein.

DETAILED DESCRIPTION OF PREFERRED EMBODIMENTS

Figure 1A:
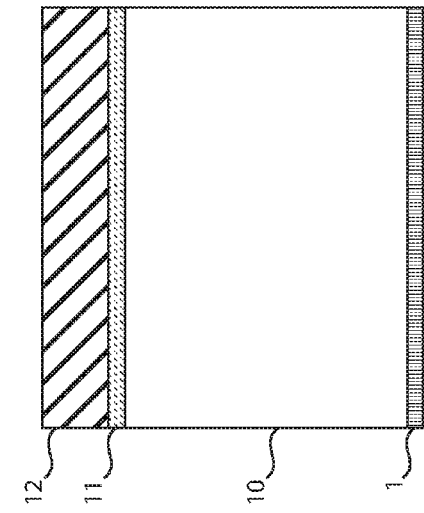
FIG. 1A is a top down planar view depicting a first plurality of fin structures in a first active region of a substrate and a second plurality of fin structures in a second active region of the substrate, wherein a gate structure is formed on the channel region of the first plurality of fin structures and extends from the first active region to the second active region to be present on the channel region of the second plurality of fin structures, in accordance with one embodiment of the methods and structures described herein.

Detailed embodiments of the claimed structures and methods are disclosed herein; however, it is to be understood that the described embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the methods and structures described herein, as it they oriented in the drawing figures. The terms "present on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

As used herein, the term "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. As used herein a "field effect transistor" is a transistor in which output current, i.e., source-drain current, is controlled by the voltage applied to the gate. A field effect transistor has three terminals, i.e., gate structure, source region and drain region. A "gate structure" means a structure used to control output current (i.e., flow of carriers in the channel) of a semiconducting device through electrical or magnetic fields. As used herein, the term "channel" is the region underlying the gate structure and between the source and drain of a semiconductor device that becomes conductive when the semiconductor device is turned on. As used herein, the term "source" is a doped region in the semiconductor device, in which majority carriers are flowing into the channel. As used herein, the term "drain" means a doped region in semiconductor device located at the end of the channel, in which carriers are flowing out of the transistor through the drain.

The etch steps for forming the electrical contacts to the gate structures of semiconductor devices, such as field effect semiconductor devices (FETs), e.g., metal oxide semiconductor field effect transistors (MOSFETs), and the etch steps for forming power rails for the semiconductor devices can be an issue leading to device failure in semiconductor devices. The term "power rail" denotes an electrical current carrying structure that powers the electrical device, i.e., provides voltage to the semiconductor device. The power rail may be in electrical communication with at least one of the source region and the drain region of the semiconductor device.

A gate cut (CT) etch is an etch process that removes a portion of a gate structure that extends from a first active region of the device to a second active region of the device. More specifically, in some process flows a gate structure, e.g., sacrificial gate structure may be patterned and etched, in which a single gate structure extends from being present on the channel region of fin structures in a first active region to being present on the channel region of the fin structures of a second active region. The gate cut (CT) etch removes the portion of the gate structure that is present between the first active region and the second active region of the device, in which isolation between the active regions of the device is desired. Removing the portion of the gate structure separating the first active region from the second active region defines two separate gate structure, i.e., a first gate structure present on a first active region, and a second gate structure present on a second active region, that are separated by a gate cut trench. The formation of the gate cut trench typically defines the tip to tip dimension separating the adjacent gate structures. In some embodiments, the methods and structures disclosed herein provide a power rail that is positioned within the gate cut trench. The term "power rail" denotes an electrical current carrying structure that powers the electrical device, i.e., provides voltage to the semiconductor device. The power rail may be in electrical communication with at least one of the source region and the drain region of the semiconductor device.

It has been determined that method sequences for forming a power rail within the gate cut trench may include etch processes that etch, i.e., gauge, the dielectric layers, e.g., oxide material layers, that are contained within the gate cut etch. For example, it has been determined that reactive ion etch (RIE) processes that are typically used to form the openings within the gate cut trench for housing the power rail can cause the formation of electrical shorts between the power rail that is positioned within the gate cut trench separating the adjacent active regions of the device and the gate structures to the semiconductor devices that are present within the active regions being separated by the gate cut trench. The RIE etch processes that result in lateral etching of the dielectrics within the gate cut trench separating the adjacent active regions may occur during the gate structure (PC) forming module.

Additionally, the etch process steps for forming the power rail may be conducted simultaneously with etching the dielectric cap that is present on the gate structures for the semiconductor devices within the active regions of the electrical device. The gate ends, i.e., the ends that dictate the tip to tip (T2T) distance that is separating the two gate structures defined by forming the gate cut trench, are typically isolated by a dielectric layer being formed thereon, such as a nitride layer, e.g., silicon nitride layer. It has been determined that during the poly open chemical mechanical planarization (POC) module that etching of the dielectric layer on the edges of the gate structures can result in shorting of the power rail to the gate structures.

In some embodiments, the methods and structures disclosed herein can overcome the aforementioned deficiencies by forming a multilayer fill of dielectric materials in the gate cut trench. For example, as will be discussed in further detail below, the multilayered fill may include alternating oxide, e.g., silicon oxide ($SiO_2$), and nitride, e.g., silicon nitride, layers. The thickness of the layers may be selected so that the height to width ratio of the layers provides an aspect ratio that obstructs dry etchants from removing the entirety of the multilayered fill when etching the power rail opening for forming the power rail. In some embodiments, the alternating oxide (inter-oxide) and nitride layers can define the boundary for power rail opening (CB) gauging. In some embodiments, the small pitch of the alternating layers of dielectric material provides a high etch resistance that obstructs gauging, e.g., lateral etching, of the dielectrics present between the gate cut trench and the functional gate structures. The method and structures for employing gate cuts with multiple-layer dielectric fill materials, are now described in more detail with reference to FIGS. 1-10.

Figure 1B:
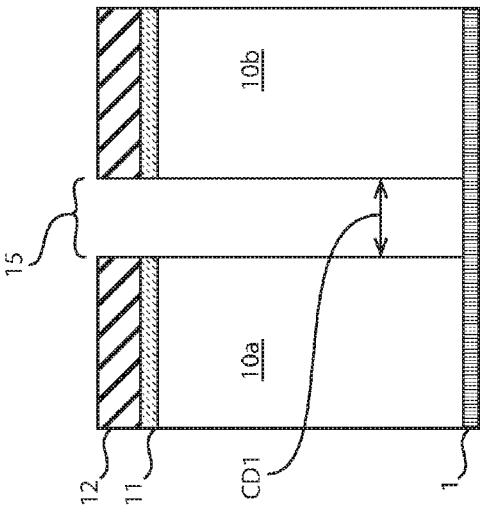
FIG. 1B is a side cross-sectional view along section line X-X (along the length of the gate structure) of the structure depicted in FIG. 1A.

FIGS. 1A and 1B depict a first plurality of fin structures 5a in a first active region of a substrate 1 and a second plurality of fin structures 5b in a second active region of the substrate 1, wherein a gate structure 10 is formed on the channel region of the first plurality of fin structures 5a and extends from the first active region to the second active region to be present on the channel region of the second plurality of fin structures 5b. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A FinFET is a semiconductor device that positions the channel region of the semiconductor device in a fin structure.

The semiconductor material that provides the fin structures 5a, 5b may be a semiconducting material including, but not limited to silicon, strained silicon, a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, gallium arsenic, indium arsenic, indium phosphide, as well as other III/V and II/VI compound semiconductors. The plurality of fin structures 5a, 5b may be formed from a semiconductor on insulator (SOI) substrate, or a bulk semiconductor substrate, using deposition photolithography and etch processes.

In one embodiment, the patterning process used to define each of the fin structures 5a, 5b is a sidewall image transfer (SIT) process. The SIT process can include forming a mandrel material layer (not shown) on the material layer that provides the fin structures 5a, 5b, such as the SOI layer of an SOI substrate, or the bulk semiconductor substrate upper surface. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal, such as, e.g., aluminum (Al), tungsten (W), or copper (Cu). The mandrel material layer can be formed by a deposition method, such as chemical vapor deposition or plasma enhanced chemical vapor deposition. In one embodiment, the thickness of the mandrel material layer can be from 50 nm to 300 nm. Following deposition of the mandrel material layer, the mandrel material layer can be patterned by lithography and etching to form a plurality of mandrel structures on the topmost surface of the semiconductor containing material that provides the fin structures 10, e.g., the SOI layer of an SOI substrate.

In some embodiments, the SIT process may continue by forming a dielectric spacer on each sidewall of each mandrel structure. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process such as, e.g., reactive ion etching (RIE). Since the dielectric spacers are used in the SIT process as an etch mask, the width of the each dielectric spacer determines the width of each fin structure 5a, 5b.

In some embodiments, after formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers into the semiconductor material layer that provides the fin structures 5a, 5b, such as the SOI layer of an SOI substrate. The pattern transfer may be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. The etching steps pattern the semiconductor material layer to provide the fin structures 5a, 5b. Following etching, i.e., pattern transfer, the SIT process may conclude with removing the dielectric spacers using an etch process or a planarization process.

It is noted that the aforementioned spacer image transfer (SIT) process is only one method of forming the fin structures 5a, 5b. In another embodiment, each of the fin structures 5a, 5b may be formed using a photoresist etch mask. Specifically, in one example, a photoresist mask is formed overlying the semiconductor composition layer which provides the fin structures 5a, 5b. The exposed portions of the semiconductor layer that provides the fin structures 5a, 5b that are not protected by the photoresist mask are removed using a selective etch process. To provide the photoresist mask, a photoresist layer is first positioned on the semiconductor layer that provides the fin structure 5a, 5b, e.g., SOI layer of an SOI substrate or upper surface of bulk semiconductor substrate. The photoresist layer may be provided by a blanket layer of photoresist material that is formed utilizing a deposition process such as, e.g., plasma enhanced CVD (PECVD), evaporation or spin-on coating.

The blanket layer of photoresist material is then patterned to provide the photoresist mask utilizing a lithographic process that may include exposing the photoresist material to a pattern of radiation and developing the exposed photoresist material utilizing a resist developer. Following the formation of the photoresist mask, an etching process may remove the unprotected portions of the semiconductor layer that provides the fin structures 5a, 5b. The etch process may be an anisotropic process, such as reactive ion etch (RIE).

Each of the fin structures 5a, 5b may have a height ranging from 5 nm to 200 nm. In another embodiment, each of the fin structures 5a, 5b has a height ranging from 10 nm to 100 nm. In one example, each of the fin structures 5a, 5b has a height ranging from 20 nm to 50 nm. Each of the plurality of fin structures 5a, 5b may have a width of less than 20 nm. In another embodiment, each of the fin structures 5a, 5b has a width W1 ranging from 3 nm to 8 nm. The pitch P1 separating adjacent fin structures 5a, 5b that are present in one of the first active region and the second active region may range from 35 nm to 45 nm. In another example, the pitch P1 separating adjacent fin structures 5a, 5b may range from 30 nm to 40 nm.

FIGS. 1A and 1B also depict a sacrificial gate structure 10. The sacrificial gate structure 10 may be composed of a material that may be removed selectively to the underlying active region, i.e., fin structures 5a, 5b, in which the geometry of the sacrificial gate structure 10 dictates the later formed functional gate structures, in which the sacrificial gate structure 10 may be replaced using a replacement metal gate (RMG) process flow. In the embodiment that is depicted in FIGS. 1A and 1B, a single sacrificial gate structure 10 extends from being present on the channel region of the first fin structures 5a in the first active region to simultaneously be present on the channel region of the second fin structures 5b, wherein at the stage of the process flow depicted in FIGS. 1A and 1B, the sacrificial gate structure is single continuous structure between the first and second active regions.

In some embodiments, the sacrificial gate structure 10 may be composed of a semiconductor material, such as silicon (Si), e.g., amorphous silicon or polysilicon. In some embodiments, a sacrificial gate cap 11, 12 may be present atop the sacrificial gate structure 10. In some embodiments, the sacrificial gate cap may 11, 12 include an oxide layer 11, e.g., silicon oxide ($SiO_2$) layer, present atop the gate conductor portion of the sacrificial gate structure 10, in which a nitride layer 12, e.g., silicon nitride layer, is present on the oxide layer 11. The gate structure 60 may be formed by using a deposition method, such as a chemical vapor deposition method and/or a physical vapor deposition (PVD), to deposit the material layers for the at least one gate dielectric layer 40 and the at least one gate electrode 45 followed by photolithography and etch processing.

Gate sidewall spacers (now shown) may be present on the sidewalls of the sacrificial gate structure 10.

FIGS. 1A and 1B also depict one embodiment of forming source and drain regions on the source and drain region portions of the fin structure 5a, 5b that are present on opposing sides of the fin structure's channel region. In some embodiments, forming the source and drain regions may include epitaxially forming in situ doped source and drain semiconductor material 20, such as silicon and germanium containing material, e.g., SiGe, on the source and drain region portions of the fin structures 5a, 5b. The term "in-situ" as used to describe the dopant that provides the conductivity type of the source and drain semiconductor material means that the dopant, e.g., p-type dopant, that dictates the conductivity type of the epitaxially formed in situ doped source and drain semiconductor material is introduced during the process step, e.g., epitaxial deposition, which forms the in situ doped source and drain semiconductor material.

In some embodiments, extension source and drain regions may be formed after the epitaxially formed in situ doped source and drain semiconductor material are positioned on the source and drain region portions of the fin structures 5a, 5b by thermally diffusing the p-type dopant from in situ doped source and drain semiconductor material into the underlying portion of the fin structures 5a, 5b. Ion implantation may also be used to dope the source and drain regions of the device. In some embodiments, the source and drain regions are activated by a high temperature anneal, while the sacrificial gate structure 10 is present in the structure. In some embodiments, a interlevel dielectric oxide fill is deposited in at least the source and drain regions, which is followed by a polishing step, e.g., planarization, such as CMP. This typically occurs before the gate cut.

Figure 2A:
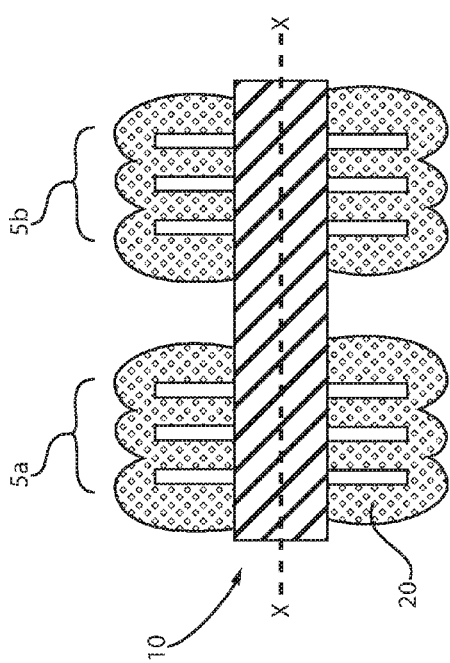
FIG. 2A is a top down planar view depicting one embodiment of removing a portion of the gate structure to form a gate cut trench separating a first portion of the gate structure overlying the first active region from a second portion of the gate structure overlying the second active region.
Figure 2B:
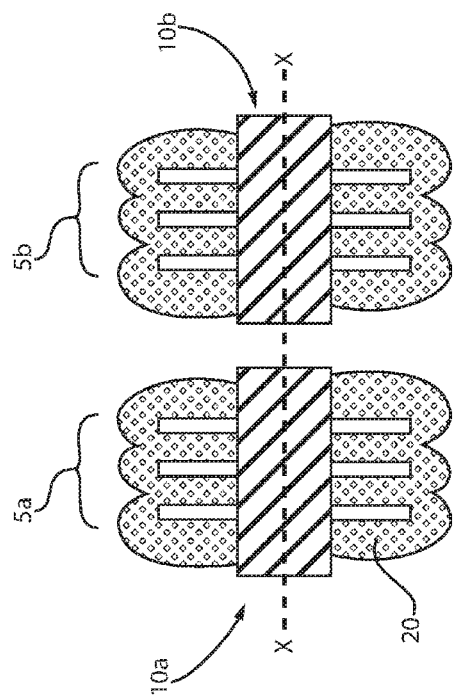
FIG. 2B is a side cross-sectional view along section line X-X (along the length of the gate structure) of the structure depicted in FIG. 2A.

FIGS. 2A and 2B depict one embodiment of removing a portion of the sacrificial gate structure 10 to form a gate cut trench 15 separating a first portion of the gate structure 10a overlying the first active region including the first plurality of fin structures 5b from a second portion of the gate structure 10b overlying the second active region including the second plurality of fin structures 5b. The portion of the sacrificial gate structure 10 being removed produces a gate cut trench 15 that provides the tip to tip (T2T) dimension separating adjacent gate structures 10a, 10b. The etch process for forming the gate cut trench 15 may be an anisotropic etch, such as reactive ion etch (RIE), gas plasma etching or laser milling/laser etching. In other embodiments, the etch process for removing the exposed portion of the blanket dielectric layer 46, recessing the exposed sacrificial gate structure 25', and recessing the exposed gate sidewall spacers 28 may be an isotropic etch, such as a wet chemical etch. In some embodiments, an etch mask, such as a photoresist mask, may be formed protecting the portions of the sacrificial gate structure 10 that remains to provide the first and second gate structures 10a, 10b, while the photoresist mask exposes the portion of the sacrificial gate structure 10 that is removed to provide the gate cut trench 15. The photoresist mask may be deposited as a photoresist layer using a deposition process, such as spin on deposition or chemical vapor deposition, wherein the photoresist layer is patterned using photolithography and developed to provide the photoresist mask.

Figure 3:
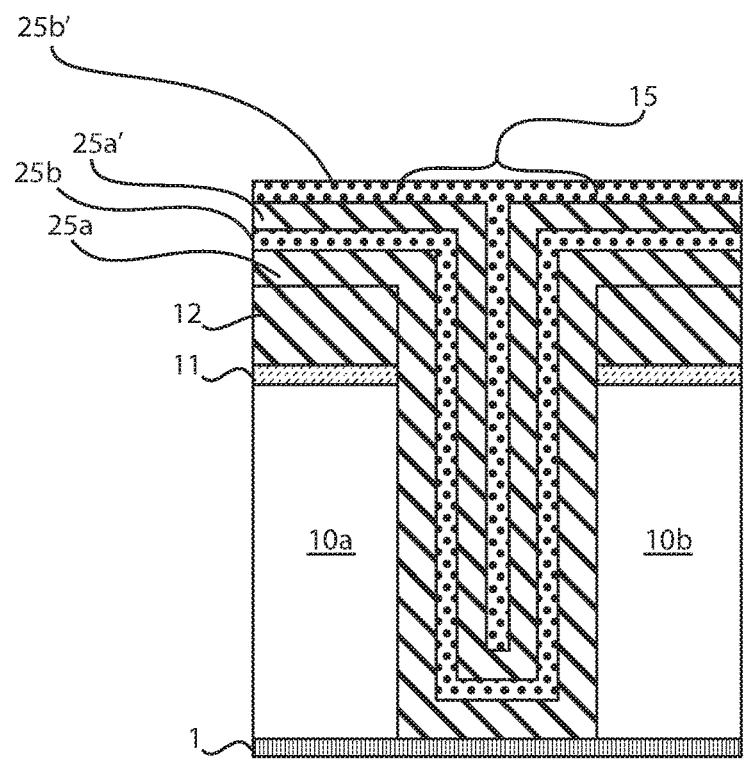
FIG. 3 is a side cross-sectional view along the length of the gate structure depicting one embodiment of forming a fill material of an alternating sequence of at least two different composition conformally deposited dielectric layers within the gate cut trench.

The first sacrificial gate structure 10a is separated from the second gate structure 10b by a gate cut trench 15, which can dictate the tip to tip (T2T) dimension that is separating the gate structures, which can be a critical dimension CD1. In some embodiments, the critical dimension CD1 may range from 40 nm to 500 nm. In some other embodiments, the critical dimension CD1 may range from 50 nm to 100 nm. FIG. 3 depicts one embodiment of forming a fill material 25a, 25b, 25a', 25b' of an alternating sequence of at least two different composition conformally deposited dielectric layers within the gate cut trench 15. The fill material 25a, 25b, 25a', 25b' may be a multi-layer liner that is employed to pinch off the CT region to create small pitch structure. The term "conformal" denotes a layer having a thickness that does not deviate from greater than or less than 30% of an average value for the thickness of the layer. Conformally deposited denotes forming a conformal layer. By "alternating sequence" it is meant that a first layer of a first composition is deposited first, followed by a second layer of a second composition on the first layer, in which that sequence of the first and second layers repeats. In some embodiments, the sequence may include only two composition materials, but the methods and structures are not limited to only this description. In other embodiments, the alternating sequence of compositions that provides the fill material for the gate cut trench 15 may include three different compositions, four different compositions, five different compositions, or any number of compositions that can be deposited in the gate cut trench. Further, although only four material layers, i.e., conformally deposited dielectric layers having reference numbers 25a, 25b, 25a', 25b', is depicted in FIG. 3, it is noted that the present description is not limited to only this example. For example, the number of conformally deposited material layer that can be deposited in the gate cut etch 15 may be equal to 3, 5, 6, 7, 8, 9, 10, 15, 20 and 25 as well as any range of material layers having an lower limit and upper limit provided by one of the above examples. For example, the number of conformal dielectric layers for providing the alternating sequence of the at least two different composition conformally deposited dielectric layers 25a, 25b, 25a', 25b' may range from 2 layers to 10 layers.

In some embodiments, the alternating sequence of said at least two different composition conformally deposited dielectric layers 25a, 25b, 25a', 25b' within the gate cut trench 15 comprises a first composition layer 25a, 25a' that is a nitride containing dielectric, and a second composition layer 25b, 25b' that is an oxide containing dielectric. A nitride containing dielectric contains nitrogen, and is typically free of oxygen. An oxide containing dielectric contains oxygen, and is typically free of nitrogen. For example, the nitride containing dielectric that provides the first composition layer 25a, 25a' may be silicon nitride. In other examples, the nitride containing dielectric that provides the first composition layer 25a, 25a' may be silicon carbon nitride (SiCN), and aluminum nitride (AlN). For example, the oxide containing dielectric that provides the second composition layer 25b, 25b' may be silicon oxide. Other examples of oxide containing dielectrics that are suitable for the second composition layer 25b, 25b' may be cerium oxide ($CeO_2$), lanthanum oxide ($La_2O_3$), yttrium oxide ($Y_2O_3$), gadolinium oxide ($Gd_2O_3$), europium oxide ($Eu_2O_3$), terbium oxide ($Tb_2O_3$) or combinations thereof. It is noted that the above compositions are provided for illustrative purposes only, and are not intended to limit the present description.

In one example, the alternating sequence of said at least two different composition conformally deposited dielectric layers within the gate cut trench comprises a first layer of silicon nitride 25a on sidewalls of the gate cut trench 15 and a base of the gate cut trench 15; a first oxide layer 25b on the first layer of silicon nitride 25a; a second silicon nitride layer 25a' on the first oxide layer 25b, a second oxide layer 25b' on the second silicon nitride layer, a third silicon nitride layer 25a' on the second oxide layer 25b', a third oxide layer (not shown) on the second silicon nitride layer, and a final silicon nitride (not shown) on the third oxide layer.

Each of the material layers for the fill material 25a, 25b, 25a', 25b' of the alternating sequence of at least two different composition conformally deposited dielectric layers within the gate cut trench 15 may be deposited to have a width and pitch between adjacent layers that produces an etch resistant structure to avoid widening of the gate cut trench, which is sometimes referred to as critical dimension blowup (CD blowup), or over-etching into the substrate during the process steps for forming a power rail within the gate cut trench 15.

Each of the material layers for the fill material 25a, 25b, 25a', 25b' within the gate cut trench 15 are conformally deposited and include a vertically orientated portion that is formed in direct contact with or formed on the sidewalls of the gate cut trench 15, and a horizontally oriented portion which is formed either in direct contact with or formed on the base of the gate cut trench 15. A core layer (also referred to as "core") may be present centrally within the gate cut trench 15, and may be vertically orientated only.

The thickness for each of the material layer 25a, 25b, 25a', 25b' of the alternating sequence of at least two different composition conformally deposited dielectric layers within the gate cut trench 15 may range from 1 nm to 10 nm. In another embodiment, the thickness for each of the material layer 25a, 25b, 25a', 25b' of the alternating sequence of at least two different composition conformally deposited dielectric layers within the gate cut trench 15 may range from 2 nm to 5 nm. The pitch separating the adjacent layers, i.e., the material layers 25a, 25b, 25a', 25b', may range from 1 nm to 10 nm, and in some examples ranges from 2 nm to 5 nm. In some examples, the height of the vertically oriented portions may be on the order of approximately 100 nm. In some embodiments, the aspect ratio of the vertically orientated portions of the alternating sequence of the at least two different composition conformally deposited dielectric layer has a height to width ratio of 5:1 or greater. In other embodiments, the aspect ratio of the vertically orientated portions of the alternating sequence of the at least two different composition conformally deposited dielectric layer has a height to width ratio of 10:1 or greater. The above dimensions are provided for illustrative purposes only, and are not intended to limit the present description, as other dimensions are also within the scope of the methods and structures disclosed herein, so long as the dimensions selected contribute to etch selectively when removing one of the material layers contained in the gate cut trench 15.

The fill material 25a, 25b, 25a', 25b' of the alternating sequence of at least two different composition conformally deposited dielectric layers within the gate cut trench 15 may be formed using chemical vapor deposition (CVD). The chemical vapor deposition (CVD) process may be selected from the group consisting of Atmospheric Pressure CVD (APCVD), Low Pressure CVD (LPCVD) and Plasma Enhanced CVD (PECVD), Metal-Organic CVD (MOCVD) and combinations thereof may also be employed. In other embodiments, the fill material 25a, 25b, 25a', 25b' of the alternating sequence of at least two different composition conformally deposited dielectric layers within the gate cut trench 15 may be formed using atomic layer deposition (ALD).

Figure 4:
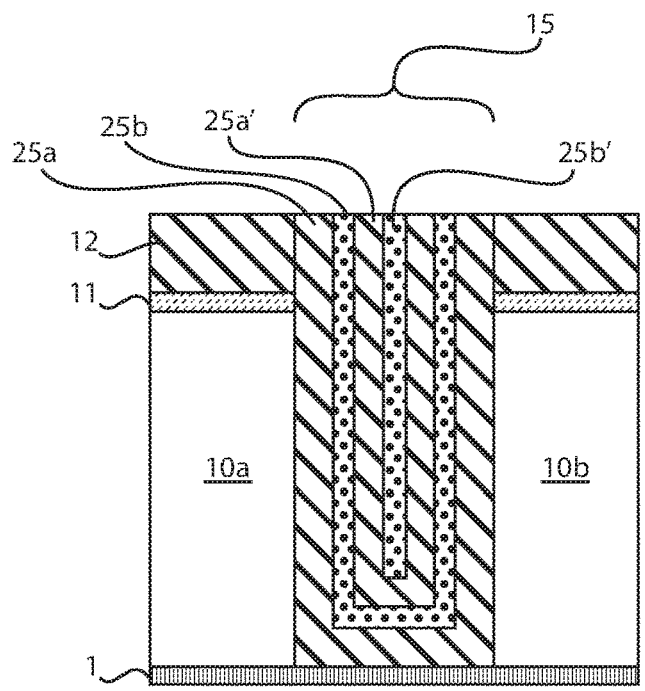
FIG. 4 is a side cross-sectional view along the length of the gate structure depicting one embodiment of planarizing the upper surface of the structure depicted in FIG. 3.

FIG. 4 depicts one embodiment of planarizing the upper surface of the structure depicted in FIG. 3. The planarization process may be chemical mechanical planarization (CMP). In some embodiments, the planarization process may be continued until the portions of the fill material 25a, 25b, 25a', 25b' of the alternating sequence of at least two different composition conformally deposited dielectric layers that extends outside the gate cut trench 15 is removed.

Figure 5:
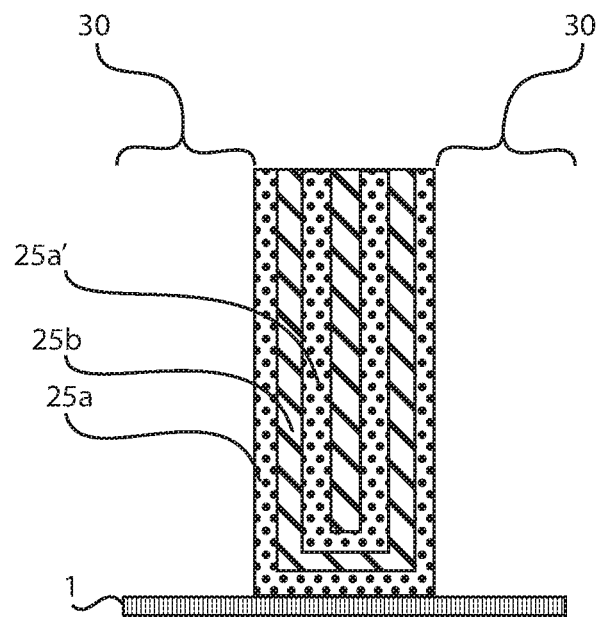
FIG. 5 is a side cross-sectional view along the length of the gate structure depicting one embodiment of removing a sacrificial gate structure.

FIG. 5 depicts on embodiment of removing sacrificial gate structures 10a, 10b, as well as the sacrificial gate cap 11, 12. The sacrificial gate structures 10a, 10b and sacrificial gate caps 11, 12 may be removed using a selective etch process. In some embodiments, and etch mask may be used in combination with the selective etch process. The term "selective" denotes that a first material may be etched at a faster rate to a second material. For example, the selective etch rate may remove a first material at a rate greater than 20:1, e.g., greater than 100:1, in comparison to a second material. The etch process may be reactive ion etch (RIE), gas plasma etching or a wet chemical etch, which can be selective to the fill material 25a, 25b, 25a', 25b' of the alternating sequence of at least two different composition conformally deposited dielectric layers within the gate cut trench 15. Removing the sacrificial gate structures 10a, 10b forms gate openings 30.

Figure 6:
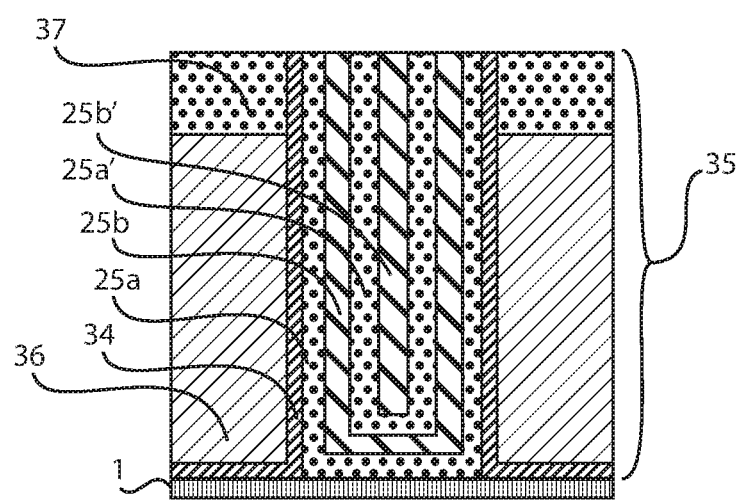
FIG. 6 is a side cross-sectional view depicting one embodiment of forming functional gate structures in the gate openings formed by removing the sacrificial gate structures.

FIG. 6 depicts forming functional gate structures 35 in the gate openings 30 formed by removing the sacrificial gate structures. The "functional gate structure" functions to switch the semiconductor device from an "on" to "off" state, and vice versa. The functional gate structures 35 are formed on the channel region of the fin structures 5a, 5b. Each functional gate structure 35 typically includes at least a gate dielectric 34 that is present on the channel region of the fin structures 5a, 5b, and a gate electrode 36 that is present on the gate dielectric 34.

In one embodiment, the at least one gate dielectric layer 34 includes, but is not limited to, an oxide, nitride, oxynitride and/or silicates including metal silicates, aluminates, titanates and nitrides. In one example, when the at least one gate dielectric layer 34 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer 34 may vary, but typically, the at least one gate dielectric layer 34 has a thickness from 1 nm to 10 nm. In another embodiment, the at least one gate dielectric layer 34 has a thickness from 1 nm to 3 nm. The at least one gate dielectric layer 34 may be deposited using a chemical vapor deposition (CVD) process, such as plasma enhanced chemical vapor deposition (PECVD).

The conductive material of the gate electrode 35 may comprise polysilicon, SiGe, a silicide, a metal or a metal-silicon-nitride such as Ta—Si—N. Examples of metals that can be used as the gate electrode 36 include, but are not limited to, Al, W, Cu, and Ti or other like conductive metals. The layer of conductive material for the gate electrode 36 may be doped or undoped. If doped, an in-situ doping deposition process may be employed. Alternatively, a doped conductive material can be formed by deposition, ion implantation and annealing. In yet another embodiment, when the fin structure 5a, 5b is being employed in a p-FinFET, the gate electrode may be composed of a p-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof. The at least one gate electrode 36 may be deposited using a physical vapor deposition process, such as plating/electroplating, or a chemical vapor deposition process, such as plasma enhanced chemical vapor (PECVD).

Still referring to FIG. 6, a dielectric gate cap 37 may be formed on top of the at least one gate electrode 36. The dielectric gate cap 37 may be composed of silicon nitride, and may be formed using a deposition process, such as chemical vapor deposition (CVD). A planarization process may be applied to the upper surface of the dielectric gate cap 37, such as chemical mechanical planarization.

Figure 7:
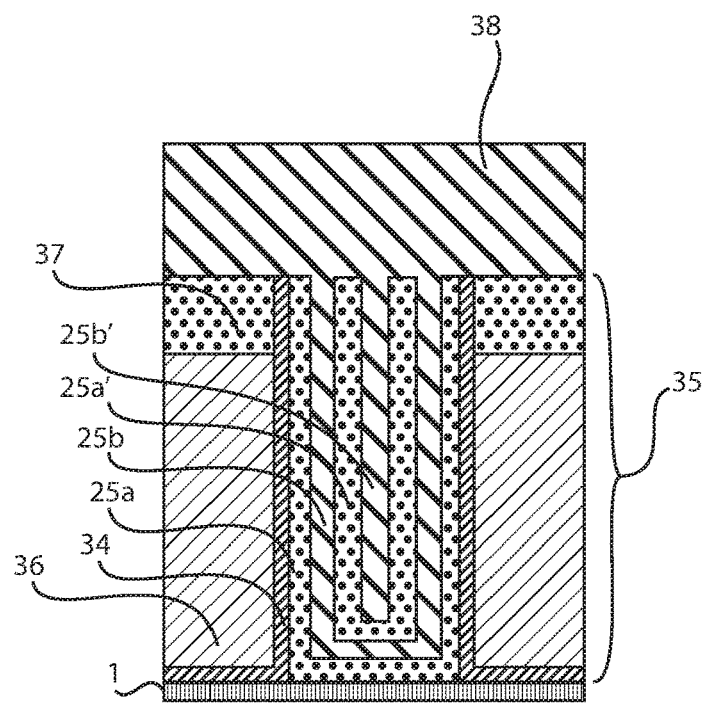
FIG. 7 is a side cross-sectional view depicting forming an interlevel dielectric layer on the structure depicted in FIG. 6, in accordance with one embodiment of the present disclosure.

FIG. 7 depicts forming an interlevel dielectric layer 38 on the structure depicted in FIG. 6. In some embodiments, the interlevel dielectric layer 31 may be selected from the group consisting of silicon containing materials, such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). The interlevel dielectric layer 38 may be deposited using chemical vapor deposition or spin on deposition.

Figure 8:
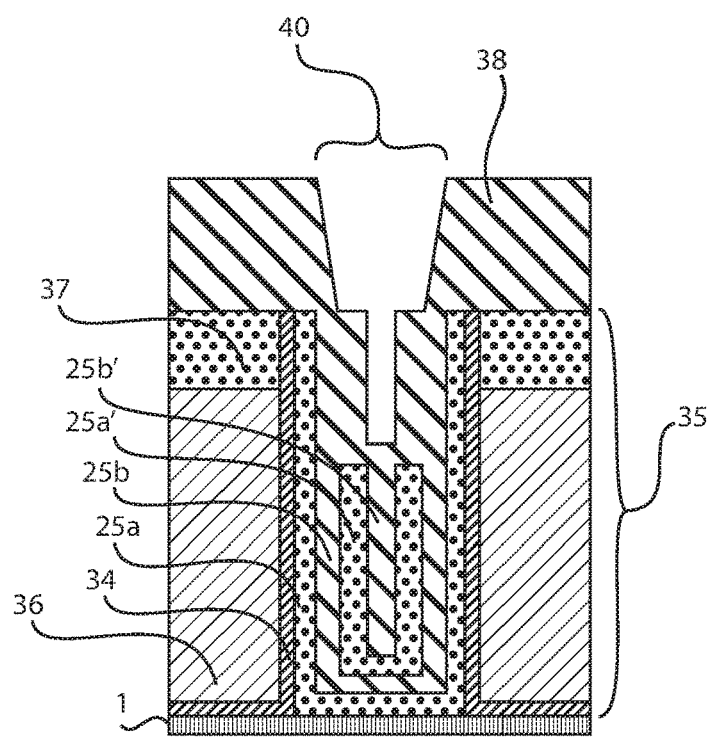
FIG. 8. is a side cross-sectional view depicting one embodiment of forming an opening through the interlevel dielectric layer and etching a first composition of the alternating material layers that provides the fill for the gate cut trench.

FIG. 8. depicts forming an opening 40 through the interlevel dielectric layer 38 and etching a first composition 25b' of the alternating material layers that provides the fill 25a, 25b, 25a', 25b' for the gate cut trench 15. The opening 40 may be formed through the interlevel dielectric layer 38 photolithography and etch processes. Specifically, and in one example, a etch mask pattern is produced by applying a photoresist to the surface to be etched, exposing the photoresist to a pattern of radiation, and then developing the pattern into the photoresist utilizing a resist developer. Once the patterning of the photoresist is completed, the sections of the interlevel dielectric layer 38 covered by the photoresist are protected, while the exposed regions are removed using a selective etching process that removes the unprotected regions to form the via openings 40. The etch process may be reactive ion etch (RIE).

FIG. 8 also depicts etching a first composition 25b' of the alternating material layers that provides the fill 25a, 25b, 25a', 25b' within the gate cut trench 15. In some embodiments, power rail formation is the same process as the process for forming the gate contact. For example, in one embodiment, a gate contact first etch step is to etch the ILD and to etch layer 25b' in the gate cut region, and a gate contact second etch step is to open the gate cap, as well as simultaneously opening layer 25a' in the gate cut region, i.e., gate cut trench 15, for the power rail.

The etch process for etching the first composition 25b of the alternating material layers within the gate cut trench may be a dry etch that is selective to that second composition 25a' of the alternating material layers that provides the fill 25a, 25b, 25a', 25b' for the gate cut trench 15. In some embodiments, selective etching is provided chemically, as well as by the dimensions and geometry, e.g., width, height, pitch, and aspect ratio, of the vertical portions of the material layers 25a, 25b, 25a', 25b' being selected to be small enough to obstruct the etchant species from over etching the material layers within the gate cut trench 15. The etch process for removing the first composition 25b' of the alternating material layers that provides the fill 25a, 25b, 25a', 25b' within the gate cut trench 15 may include reactive ion etching, gas plasma etching, ion beam etching or a combination thereof. Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface.

Removing the first composition 25b' of the alternating material layers that provides the fill 25a, 25b, 25a', 25b' within the gate cut trench 15 selectively to the second composition 25a' substantially eliminates over etching in both the vertical and lateral directions.

Figure 9:
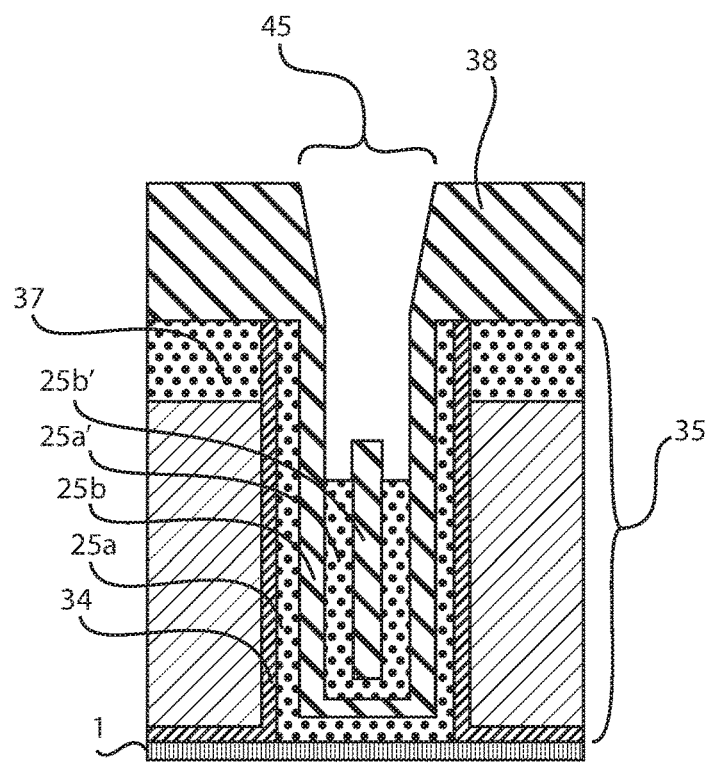
FIG. 9 is a side cross-sectional view depicting etching a second composition of the alternating material layers that provides the fill for the gate cut trench to form the power rail opening.

FIG. 9 is a side cross-sectional view depicting etching a second composition 25a' of the alternating material layers 25a, 25b, 25a', 25b' that provides the fill for the gate cut trench 15 to form the power rail opening 45. The etch process for etching the second composition 25a' of the alternating material layers within the gate cut trench 15 may be a dry etch that is selective to that first composition 25b' of the alternating material layers that provides the fill 25a, 25b, 25a', 25b' for the gate cut trench 15. In some embodiments, selective etching is provided chemically, as well as by the dimensions and geometry, e.g., width, height, pitch, and aspect ratio, of the vertical portions of the material layers 25a, 25b, 25a', 25b' being selected to be small enough to obstruct the etchant species from over etching the material layers within the gate cut trench 15. The etch process for removing the second composition 25a' of the alternating material layers that provides the fill 25a, 25b, 25a', 25b' within the gate cut trench 15 may include reactive ion etching, gas plasma etching, ion beam etching or a combination thereof. Removing the second composition 25a' of the alternating material layers that provides the fill 25a, 25b, 25a', 25b' within the gate cut trench 15 selectively to the first composition 25b' substantially eliminates over etching in both the vertical and lateral directions.

Figure 10:
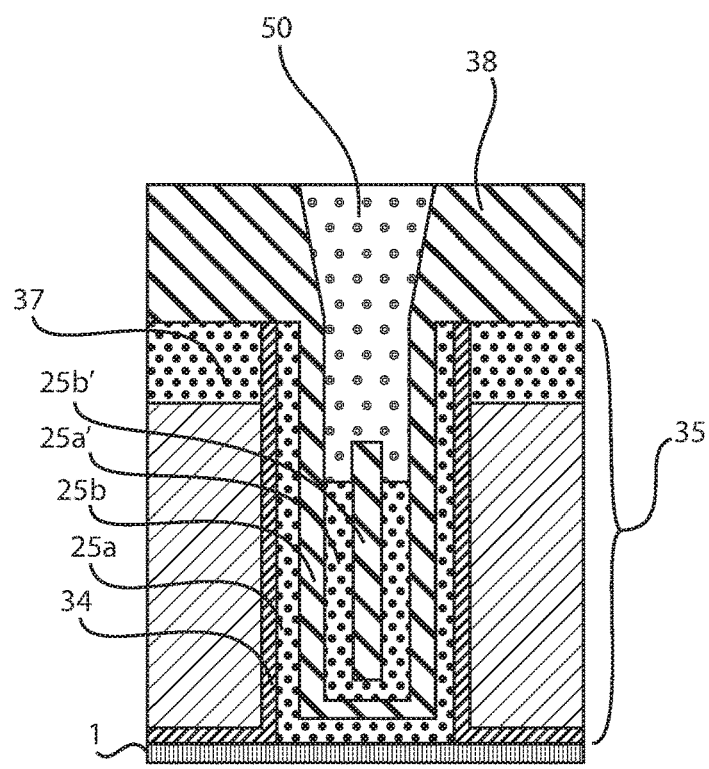
FIG. 10 is a side cross-sectional view depicting one embodiment of depositing an electrically conductive material in the power rail opening depicted in FIG. 10 to form the power rail.

FIG. 10 depicts one embodiment of depositing an electrically conductive material in the power rail opening 45 to form the power rail 50. The power rail openings 45 may be filled with an electrically conductive material to provide the power rail 50. The electrically conductive material of the power rail 50 may be a metal, such as aluminum, copper, tungsten, titanium, tantalum, platinum, gold, silver or a combination thereof. In some embodiments, the electrically conductive material of the power rail 50 may be deposited using physical vapor deposition (PVD), chemical vapor deposition (CVD) or atomic layer deposition (ALD) methods. In one example, in which the metal layer of nickel (Ni) and platinum (Pt) is deposited by physical vapor deposition (PVD) method, the deposition process may include sputtering. Examples of sputtering apparatus that may be suitable for depositing the electrically conductive material for the power rail 50 include DC diode type systems, radio frequency (RF) sputtering, magnetron sputtering, and ionized metal plasma (IMP) sputtering. In another example, the metal layer including nickel (Ni) and platinum (Pt) within the power rail opening 40 using plating processes, such as electroplating or electroless plating. In the embodiments, in which electrically conducive material may be deposited into the power rail openings using chemical vapor deposition (CVD), in which the chemical vapor deposition (CVD) process may be selected from the group consisting of Atmospheric Pressure CVD (APCVD), Low Pressure CVD (LPCVD) and Plasma Enhanced CVD (PECVD), Metal-Organic CVD (MOCVD) and combinations thereof may also be employed. It is noted that the aforementioned examples of deposition processes are provided for illustrative purposes only, and are not intended to limit the present description, as other deposition processes may be equally applicable, so long as enough material.

Referring to FIGS. 1A-10, in another aspect, an electrical device is provided that a first active region (including a first plurality of fin structures 5a) having a first gate structure 35; and a second active region (including a second plurality of fin structures 5b) having a second gate structure 35. In some embodiments, the first and second gate structures 35 are aligned to one another and separated by a gate cut trench 15. The gate cut trench 15 is typically filled with an alternating sequence of a nitride containing conformal layer 25a, 25a' and an oxide containing conformal layer 25b, 25b' filling a lower portion of the gate cut trench, wherein a core of one of the nitride containing 25a, 25a' or the oxide containing material 25b, 25b' is centrally positioned in the lower portion of the gate cut trench 15. In the embodiment depicted in FIG. 10, the core is composed of an oxide containing material 25b', e.g., silicon oxide. Referring to FIGS. 1A-10, a power rail 50 is present in an upper portion of the gate cut trench 15. In some embodiments, the aspect ratio of the vertically orientated portions of the alternating sequence of the nitride containing conformal layer 25a, 25a' and the oxide containing conformal layer 25b, 25b' have a height to width ration of 5:1 or greater.

Having described preferred embodiments of a structure and method for forming GATE CUT WITH INTEGRATED ETCH STOP LAYER, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An electrical device comprising:
a first active region having a first gate structure;
a second active region having a second gate structure, wherein the first and second gate structures are aligned to one another and separated by a gate cut trench;
an alternating sequence of a first dielectric conformal layer and a second dielectric conformal layer filling a lower portion of the gate cut trench, wherein a core of one of the first and second conformal dielectric layers is centrally positioned in the lower portion of the gate cut trench; and
a power rail in an upper portion of the gate cut trench, wherein the lower portion of the gate cut trench begins at the base of the power rail and extends to a base of the gate cut trench.

2. The electrical device of claim 1, wherein the first gate structure is present on a channel region on at least one fin structure in the first active region.

3. The electrical device of claim 1, wherein the second gate structure is present on at least one fin structure in the second active region.

4. The electrical device of claim 1, wherein the aspect ratio of the vertically orientated portions of the alternating sequence of a nitride containing conformal layer and an oxide containing conformal layer have a height to width ration of 5:1 or greater.

5. The electrical device of claim 1, wherein the gate cut trench is present through an interlevel dielectric layer extending between adjacent portions of the first gate structure and the second gate structure that have been separated by the gate cut trench.

6. The electrical device of claim 1, wherein the alternating sequence of at least two different composition conformally deposited dielectric layers within the gate cut trench comprises a silicon nitride layer and a silicon oxide layer.

7. An electrical device comprising:
a first active region having a first gate structure;
a second active region having a second gate structure, wherein the first and second gate structures are separated by a gate cut trench;
at least one dielectric layer filling a lower portion of the gate cut trench; and a power rail in an upper portion of the gate cut trench, wherein the lower portion of the gate cut trench begins at the base of the power rail and extends to a base of the gate cut trench.

8. The electrical device of claim 7, wherein the first gate structure is present on a channel region on at least one fin structure in the first active region.

9. The electrical device of claim 7, wherein the second gate structure is present on at least one fin structure in the second active region.

10. The electric device of claim 7, wherein at least one dielectric layer filling the lower portion of the gate cut trench comprises an alternating sequence of a first dielectric conformal layer and a second dielectric conformal layer.

11. The electrical device of claim 10, wherein a core of one of the first and second conformal dielectric layers is centrally positioned in the lower portion of the gate cut trench.

12. The electrical device of claim 11, wherein the aspect ratio of the vertically orientated portions of the alternating sequence of the nitride containing conformal layer and the oxide containing conformal layer have a height to width ration of 5:1 or greater.

13. The electrical device of claim 12, wherein the gate cut trench is present through an interlevel dielectric layer extending between adjacent portions of the first gate structure and the second gate structure that have been separated by the gate cut trench.

14. The electrical device of claim 13, wherein the alternating sequence of said at least two different composition conformally deposited dielectric layers within the gate cut trench comprises a silicon nitride layer and a silicon oxide layer.

15. An electrical device comprising:
a first gate structure;
a second gate structure;
a gate cut trench present between the first gate structure and the second gate structure;
a dielectric filling a lower portion of the gate cut trench; and
a power rail in an upper portion of the gate cut trench, wherein the lower portion of the gate cut trench begins at the base of the power rail and extends to a base of the gate cut trench.

16. The electrical device of claim 15, wherein the first gate structure is present on a channel region on at least one fin structure in a first active region.

17. The electrical device of claim 15, wherein the second gate structure is present on at least one fin structure in a second active region.

18. The electric device of claim 15, wherein the dielectric filling the lower portion of the gate cut trench comprises an alternating sequence of a first dielectric conformal layer and a second dielectric conformal layer.

19. The electrical device of claim 18, wherein a core of one of the first and second conformal dielectric layers is centrally positioned in the lower portion of the gate cut trench.

20. The electrical device of claim 18, wherein the gate cut trench is present through an interlevel dielectric layer extending between adjacent portions of the first gate structure and the second gate structure that have been separated by the gate cut trench.

* * * * *